United States Patent [19]

Koyamada et al.

[11] 4,126,837
[45] Nov. 21, 1978

[54] IMPEDANCE ELEMENT AND BAND-REJECTION FILTER USING THE SAME

[75] Inventors: Yahei Koyamada, Tokorozawa; Fujio Ishihara, Tokyo, both of Japan

[73] Assignee: Nippon Telegraph and Telephone Public Corporation, Tokyo, Japan

[21] Appl. No.: 723,502

[22] Filed: Sep. 15, 1976

Related U.S. Application Data

[63] Continuation of Ser. No. 565,351, Apr. 7, 1975, abandoned.

[30] Foreign Application Priority Data

Jul. 1, 1974 [JP] Japan .................................. 49-75221
Jul. 1, 1974 [JP] Japan .................................. 49-75222
Jul. 1, 1974 [JP] Japan .................................. 49-75223

[51] Int. Cl.$^2$ .................... H03H 9/04; H03H 9/20; H03H 9/26; H03H 13/00
[52] U.S. Cl. ..................................... 333/72; 333/30 R
[58] Field of Search ............... 333/30 R, 72, 71, 30 M; 310/313; 331/107 A

[56] References Cited

U.S. PATENT DOCUMENTS 3,760,204  9/1973  Yester, Jr. ........................ 333/72 X

OTHER PUBLICATIONS

Geffe - "Simplified Modern Filter Design," John F. Rider Publisher, Inc., New York, 1963; pp. 52-54 & title page.

Primary Examiner—Alfred E. Smith
Assistant Examiner—Marvin Nussbaum
Attorney, Agent, or Firm—Marshall & Yeasting

[57] ABSTRACT

An impedance element is disclosed which is formed with an electro-elastic surface wave transducing device composed of a substrate for the propagation of an elastic surface wave and an electro-elastic surface wave transducer disposed on the substrate for converting an electrical signal into an elastic surface wave or vice versa. The impedance element has a frequency-impedance characteristic that it exhibits a sufficiently high impedance in a predetermined frequency band but a sufficiently low impedance in the other frequency bands.

Further, a band-rejection filter is disclosed which includes the abovesaid impedance element and has a band-rejection filter characteristic dependent upon the frequency-impedance characteristic of the impedance element.

12 Claims, 21 Drawing Figures

IMPEDANCE ELEMENT AND BAND-REJECTION FILTER USING THE SAME

This is a continuation of application Ser. No. 565,351 filed Apr. 7, 1975, now abandoned.

BACKGROUND OF THE INVENTION

1. Field of the Invention

This invention relates to an impedance element which exhibits a sufficiently high impedance in a predetermined frequency band but shows a sufficiently low impedance outside of the predetermined frequency band, and a band-rejection filter employing the impedance element.

2. Description of the Prior Art

Heretofore, there have been proposed a variety of impedance elements or circuits which show a high impedance in a predetermined frequency band but exhibit a low impedance outside thereof. By inserting such an impedance element or circuit, for example, in series, in a transmission line, a signal supplied to the input side of the transmission line is derived at the output side thereof while being rejected over the predetermined frequency band in which the impedance element or circuit exhibits a high impedance. Namely, a band-rejection filter is provided. The band-rejection filter characteristic of the band-rejection filter thus formed is dependent upon the frequency-impedance characteristic of the impedance element or circuit used.

With the conventional types of impedance elements or circuits, in the case where the predetermined frequency band in which they show a high impedance is selected to lie within a frequency band such as the VHF or UHF band, it is relatively difficult to make the width of the predetermined frequency band narrow and to obtain a sharp or abrupt frequency-impedance characteristic. Further, it is also relatively difficult to make sufficiently large the ratio of the impedance exhibited in the predetermined frequency band to the impedance in the other frequency bands. Moreover, in the case of forming an impedance element exhibiting such a frequency-impedance characteristic which provides a relatively narrow width of the predetermined frequency band for high impedance, and is sharp or abrupt, there is a disadvantage that the impedance element is large in size.

As a result of this, in a band-rejection filter constructed with the conventional impedance element, it is particularly difficult to obtain in the VHF or UHF band such a band-rejection filter characteristic which provides a relatively narrow band-width of a predetermined rejection band and is sharp. Further, in the conventional band-rejection filter, it is relatively difficult to obtain such a band-rejection filter characteristic that attenuation in a predetermined rejection band is sufficiently larger than attenuation in the other frequency bands. Moreover, the conventional band-rejection filter has a defect of bulkiness.

SUMMARY OF THE INVENTION

Accordingly, one object of this invention is to provide an impedance element such that even if a predetermined frequency band in which it exhibits a high impedance lies within a high frequency band such as the VHF or UHF band, its predetermined band-width can be made narrow, and accordingly the frequency-impedance characteristic can be made sharp, as desired.

Another object of this invention is to provide an impedance element which exhibits a sufficiently high impedance in a predetermined frequency band and a sufficiently low impedance in the other frequency bands and in which the ratio of the high impedance to the lower one can be made sufficiently large.

Another object of this invention is to provide an impedance element with which it is possible to obtain a desired frequency-impedance characteristic without increasing the overall sizes of the element.

Another object of this invention is to provide a band-rejection filter with which it is possible to obtain such a band-rejection filter characteristic which enables the width of its band-rejection band in the VHF or UHF band to be made narrow at will by the use of the above-said impedance element, and hence is sharp.

Still another object of this invention is to provide a band-rejection filter which has such a band-rejection filter characteristic that attenuation in a predetermined frequency band is sufficiently larger than that in the other frequency bands.

Still a further object of this invention is to provide a band-rejection filter with which it is possible to obtain a desired band-rejection filter characteristic without increasing the overall sizes of the filter.

The impedance element according to this invention is formed by utilizing an electro-elastic surface wave transducing device for converting an electrical signal into an elastic surface wave or vice versa. The electro-elastic surface wave transducing device is provided with at least a substrate for the propagation thereon of an elastic surface wave and an electro-elastic surface wave transducer disposed on the major surface of the substrate. The electro-elastic surface wave transducing device converts an electrical signal into an elastic surface wave by the piezoelectric property of the substrate itself or the piezoelectric effect of a piezoelectric layer formed on the substrate. The electro-elastic surface wave transducer has a pair of electrodes of interdigital conductor structure.

With such an electro-elastic surface wave transducing device, various experiments were conducted by the present inventors. As a result of the experiments, it has been found that the frequency-impedance characteristic considered between the pair of electrodes of interdigital conductor structure is dependent upon the distance between adjacent ones of fingers of the interdigital conductors of the electrodes and upon the number of the fingers of the interdigital conductors. Especially, by selecting the number of the fingers of the interdigital conductors used is selected to be sufficiently large, for example, in the range of 200 to 300 in the case of the substrate being formed of lithium niobate, the reactance component of impedance becomes inductive only in a predetermined frequency band but capacitive at the other frequency bands. And the impedance is very high in the predetermined frequency band but very low in the other frequency bands, and the predetermined frequency band in which the impedance is very high can be made sufficiently narrow as desired, and accordingly a sharp can frequency-impedance characteristic be obtained. Further, it has also been found that the electro-elastic surface wave transducing device can be relatively easily constructed small as desired.

The impedance element of this invention, which is constructed by utilizing the electro-elastic surface wave transducing device, employs, as a pair of connecting terminals, a pair of terminals led out from between the pair of electrodes of the transducer of the electro-elastic surface wave transducing device. Accordingly, the impedance element of this invention has the frequency-impedance characteristic of the electro-elastic surface wave transducing device.

Since the frequency-impedance characteristic of the electro-elastic surface wave transducing device forming the impedance element of this invention is such as providing an extremely high impedance in the predetermined frequency band but a sufficiently low impedance in the other frequency bands, as described above, and since the abovesaid predetermined frequency band can be made sufficiently narrow, the frequency-impedance characteristic of the impedance element can be made such that the element exhibits an extremely high impedance in the above predetermined frequency band but a sufficiently low impedance in the other frequency bands, and the predetermined frequency band can be made sufficiently narrow.

Further, the impedance element according to this invention can be easily reduced in size because the electro-elastic surface wave transducing device making up it can be easily reduced in size.

The band-rejection filter according to this invention is constructed to include the impedance element of this invention mentioned above. Accordingly, the band-rejection filter according to this invention can be obtained to have such a band-rejection filter characteristic that attenuation is very large in a predetermined rejection band but sufficiently small in the other frequency bands outside of the predetermined rejection band and that the width of the predetermined rejection band can be made sufficiently small as desired, and accordingly the band-rejection filter characteristic can be made sharp.

Further, the band-rejection filter according to this invention is constructed to include the impedance element of this invention, and hence can be reduced in size.

Other objects, features and advantages of this invention will become apparent from the following description taken in conjunction with the accompanying drawings.

DESCRIPTION OF THE PREFERRED EMBODIMENTS

Figure 1:
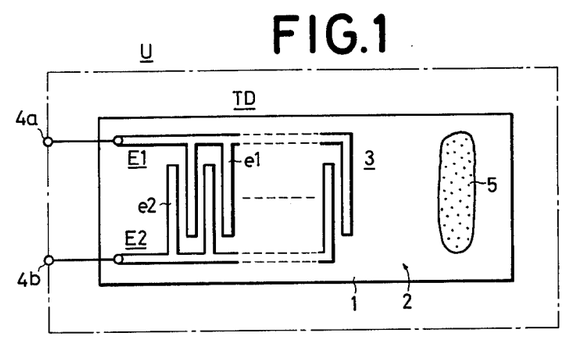
FIG. 1 is a schematic diagram showing an embodiment of the impedance element according to this invention.

In FIG. 1, there is shown an embodiment of the impedance element according to this invention, indicated generally by a reference character U which is formed with an electro-elastic surface wave transducing device TD.

The electro-elastic surface wave transducing device TD is provided with a substrate 1 for elastic surface wave propagation and an electro-elastic surface wave transducer 3 disposed on the major surface 2 of the substrate 1 for converting an electrical signal into an elastic surface wave or vice versa. The substrate 1 is formed with a piezoelectric substrate as of crystal, lithium niobate or the like, or composed of a non-piezoelectric substrate and a piezoelectric layer deposited thereon. In FIG. 1, the substrate 1 is shown to be piezoelectric.

The transducer 3 is composed of a pair of electrodes E1 and E2 disposed on the substrate 1. This pair of electrodes E1 and E2 have an interdigital conductor structure. Reference characters $e1$ and $e2$ indicate fingers of the electrodes E1 and E2, respectively. In this case, the number of the fingers of the interdigital conductors, (the number of pairs of adjacent ones of the fingers $e1$ and $e2$ of the electrodes E1 and E2) is selected, for example, in the range of 200 to 300 on the substrate of lithium niobate. On the substrate 1 is disposed an elastic surface wave absorber 5 for absorbing an elastic surface wave. A pair of terminals 4a and 4b led out from the electrodes E1 and E2 of the transducer 3 of the electro-elastic surface wave transducing device TD are employed as external connection terminals of the impedance element U.

Figure 2:
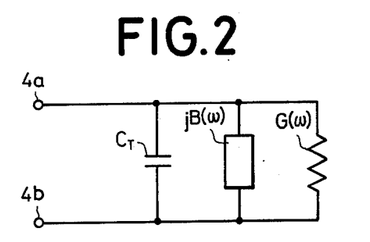
FIG. 2 is an equivalent circuit of the impedance element of FIG. 1.
Figure 3:
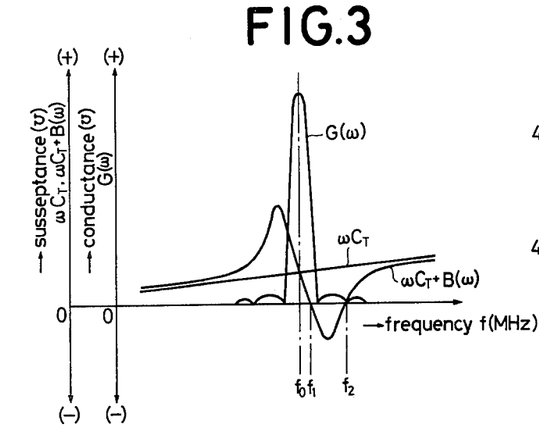
FIG. 3 is a graph showing the characteristics of the impedance element of FIG. 1.

As shown in FIG. 2, the electro-elastic surface wave transducing device TD is expressed in the form of an equivalent admittance circuit in which a capacitance generally indicated by $C_T$, a radiation susceptance generally indicated by a function $jB(\omega)$ containing $\omega$ and a radiation conductance generally indicated by a function $G(\omega)$ containing $\omega$ are connected in parallel between the terminals 4a and 4b, where $\omega$ is an angular frequency and if frequency is taken as $f$, it is expressed such that $\omega = 2\omega f$.

Where the number of the fingers of the interdigital conductors of the electrodes E1 and E2 of the transducer 3 is selected to be of a suitable value, for example, in the range of 200 to 300 on the substrate of lithium niobate, the conductance $G(\omega)$ exhibits such a single hump characteristic as shown in FIG. 3. In FIG. 3, the abscissa represents the frequency $f$ and the ordinate represents conductance (ᴠ) of $G(\omega)$ and susceptance $\omega C_T$ and $\{\omega C_T + B(\omega)\}$. In this case, the frequency at which the value of the conductance $G(\omega)$ is maximum is referred to as a resonance frequency $f_0$ of the electro-elastic surface wave transducing device TD and the resonance frequency $f_0$ is determined mainly by the distance between adjacent ones of fingers of the electrodes E1 and E2 of the transducer 3. $\omega C_T$ is expressed by an inclined straight line crossing the characteristic curve of the conductance $G(\omega)$ in FIG. 3 and its gradient dependent mainly upon the width of each of fingers and the number of the fingers of the interdigital conductors of the electrodes E1 and E2 of the transducer 3. Further, where the number of the fingers of the interdigital conductors of the electrodes E1 and E2 of the transducer 3 is selected to be of a suitable value in the range of, for example, 200 to 300 on the substrate of lithium niobate, as mentioned above, $\{\omega C_T + B(\omega)\}$ similarly exhibits an S-letter characteristic crossing the abscissa. The center frequency in the S-letter characteristic is a frequency $f_1$ a little higher than the resonance frequency $f_0$ and the skirt of the curve representing this S-letter characteristic gradually approaches the straight line indicative of $\omega C_T$ and crosses the abscissa. A frequency $f_2$ at the position where the curve indicative of the S-letter characteristic crosses the abscissa corresponds to the frequency at the position where the value ( υ ) of the conductance $G(\omega)$ becomes zero, if the number of the fingers of the interdigital conductors is suitably selected, and this frequency $f_2$ is referred to as an anti-resonance frequency. The width of the S-letter characteristic curve in the direction of the ordinate is also dependent upon the number of the fingers of the interdigital conductors of the electrodes E1 and E2 of the transducer 3. Further, the position of the anti-resonance frequency $f_2$ is obtained by adjustment of the number of the fingers of the interdigital conductors of the electrodes E1 and E2 of the transducer 3.

Figure 4:
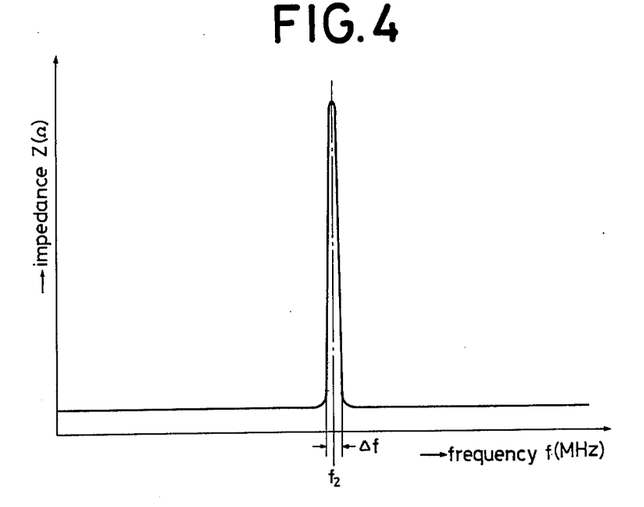
FIG. 4 is a graph showing the frequency-impedance characteristic of the impedance element of FIG. 1.

Accordingly, the electro-elastic surface wave transducing device TD exhibits a maximum impedance of extremely large value at the anti-resonance frequency $f_2$ between the terminals 4a and 4b. Such an electro-elastic surface wave transducing device TD generally has a frequency $f$ - impedance Z characteristic such as depicted in FIG. 4 in which the impedance of the device TD is sufficiently high in a relatively narrow band centering about the anti-resonance frequency $f_2$ and is sufficiently low in the other bands. This frequency-impedance characteristic is sharp. Moreover, such an electro-elastic surface wave transducing device TD has the function of a capacitance element of the capacitance $C_T$ at frequencies apart from the anti-resonance frequency $f_2$.

In the case where the substrate 1 is formed of lithium niobate; the distance between the centers of adjacent ones of the fingers e1 and e2 of the electrodes E1 and E2 of the transducer 3 is 0.015mm; the width of overlapping of the fingers e1 and e2 of the electrodes E1 and E2 in the direction perpendicular to the lengthwise direction of the fingers is uniform and 1mm; and the number of the fingers is suitably selected in the range of 200 to 300, the frequency-impedance characteristic of the electro-elastic surface wave transducing device TD has a sufficiently narrow bandwidth of centering about the antiresonance frequency $f_2$ of 110MHz and, hence is sharp.

Further, an electrical signal which is supplied between the terminals 4a and 4b of the electro-elastic surface wave transducing device TD is converted by the transducer 3 into an elastic surface wave. The elastic surface wave thus obtained propagates on the surface of the substrate 1 and is absorbed by the absorber 5. The absorber 5 effectively avoids that the elastic surface wave propagating on the substrate 1 is reflected back to the transducer 3.

Thus, the impedance element of this invention, which is formed with the electro-elastic surface wave transducing device TD, has a frequency-impedance characteristic that it exhibits an extremely high impedance in the predetermined frequency band but shows a sufficiently low impedance in the other frequency bands, and the width $\Delta f$ of the abovesaid predetermined frequency band can be relatively narrow and the frequency-impedance characteristic is sharp. Further, the electro-elastic surface wave transducing device TD itself is of such a simple construction as comprising only the substrate 1 and the transducer 3 disposed on its major surface 2 and, even if the number of the fingers of the electrodes E1 and E2 of the transducer 3 is selected in the range of 200 to 300, the distance between adjacent ones of the fingers may be selected extremely short, as mentioned previously. Therefore, the transducer 3 can be formed small, and consequently the impedance element of this invention can be easily constructed small.

Figure 5:
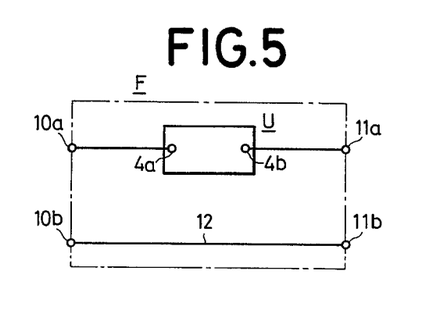
FIG. 5 is a connection illustrating a first embodiment of the band-rejection filter according to this invention.

FIG. 5 illustrates a first embodiment of the band-rejection filter according to this invention, generally indicated by a reference character F, which is constructed to include the impedance element U of this invention described previously with regard to FIG. 1. The band-rejection filter F has a pair of input terminals 10a and 10b and a pair of output terminals 11a and 11b. The input terminal 10a is connected to one connection terminal 4a of the impedance element U and the other connection terminal 4b of the impedance element U is connected to the output terminal 11a. Further, the input terminal 10b is connected to the output terminal 11b through a line 12.

Figure 6:
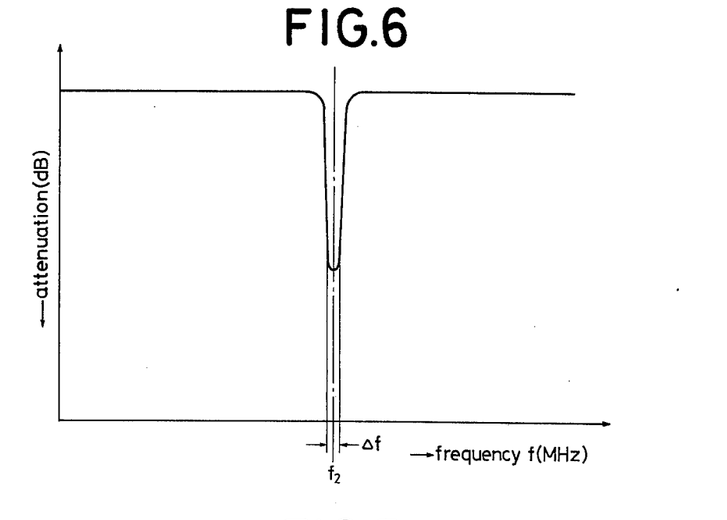
FIG. 6 is a graph showing the band-rejection filter characteristic of the band-rejection filter of FIG. 5.

In such a band-rejection filter, the impedance element U of this invention, which has the frequency $f$ - impedance Z characteristic shown in FIG. 4 is connected in series between the input terminals 10a and 10b and the output terminals 11a and 11b. Accordingly, such a band-rejection filter shows such a band-rejection filter characteristic as depicted in FIG. 6 in which a frequency band of a relatively narrow width $\Delta f$ centering about the frequency $f_2$ is a rejection band. The attenuation (in dB) in the rejection band is extremely large but the attenuation in the other bands is sufficiently small and this band-rejection filter characteristic is sharp.

Thus, in accordance with the first embodiment of the band-rejection filter according to this invention, it is possible to obtain such a band-rejection filter characteristic that the attenuation is extremely large in the predetermined frequency band but sufficiently small in the other frequency bands and that the width $\Delta f$ of the predetermined rejection band can be sufficiently reduced as desired, and hence the band-rejection filter characteristic can be made sharp. Further, in accordance with the first embodiment of the band-rejection filter of this invention, since it is constructed to include the impedance element U, described previously in connection with FIG. 1, which can be easily miniaturized, the filter can be easily formed small in size.

Figure 7:
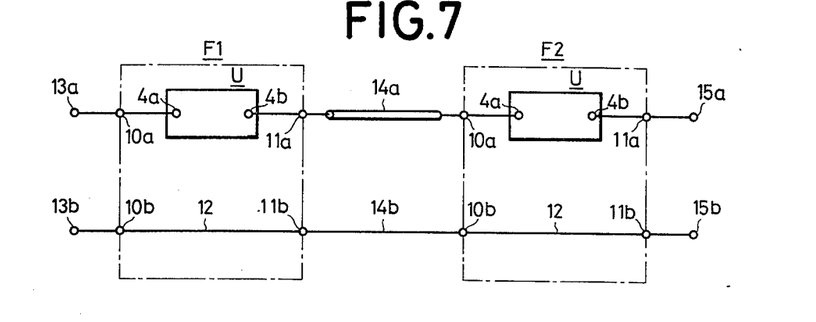
FIG. 7 is a connection diagram illustrating a second embodiment of the band-rejection filter according to this invention.

FIG. 7 shows a second embodiment of the band-rejection filter of this invention. In the present embodiment, parts corresponding to those in FIG. 5 are marked with the same reference numerals and characters and no detailed description will be repeated. This embodiment employs two band-rejection filters F (identified as F1 and F2, respectively) of the construction described above with respect to FIG. 5. These band-rejection filters F1 and F2 are of cascade construction. Namely, input terminals 13a and 13b are led out from the input terminals 10a and 10b of one band-rejection filter F1, respectively. The output terminals 11a and 11b of the band-rejection filter F1 are connected to the input terminals 10a and 10b of the other band-rejection filter F2, respectively, through a transmission lines 14a and 14b. The line 14a constitutes a distribution constant type line of a length which is given by $(n\pm\frac{1}{4})\lambda_2$, if the wavelength for the aforesaid center frequency $f_2$ is taken as $\lambda_2$, (n being 0, 1, 2, . . .). On the other hand, output terminals 15a and 15b are led out from the output terminals 11a and 11b of the band-rejection filter F2.

In such a band-rejection filter, two band-rejection filters described above in connection with FIG. 5 are connected to each other in cascade through the transmission lines 14a and 14b, so that attenuation in the rejection band is twice that obtainable with the band-rejection filter of FIG. 5, though not described in detail. Namely, it is possible to obtain more excellent band-rejection filter characteristic than that of the band-rejection filter of FIG. 5.

Figure 8:
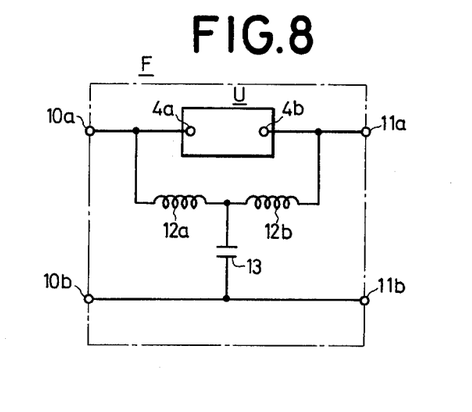
FIGS. 8, 9 and 10 are connection diagrams illustrating third, fourth and fifth embodiments of the band-rejection filter according to this invention, respectively.

FIG. 8 illustrates a third embodiment of the band-rejection filter of the present invention. In this embodiment, at least one of capacitance elements of an all-pass network constructed to include inductance elements or circuits and the capacitance elements is replaced with the impedance element U of this invention described previously with regard to FIG. 1, whereby a band-rejection filter characteristic is obtained as a whole.

In FIG. 8, parts corresponding to those in FIG. 5 are identified by the same reference numerals and characters and no detailed description will be given. One input terminal 10a is connected to one connection terminal 4a of the impedance element U and the other connection terminal 4b of the impedance element U is connected to one output terminal 11a. Accordingly, the input terminals 10a and the output terminal 11a are interconnected through the impedance element U. Further, inductance elements 12a and 12b are connected in series to each other and one end of the series circuit is connected to the input terminal 10a and the other end is connected to the output terminal 11a. Moreover, the connection point of the inductance elements 12a and 12b is connected to the input terminal 10a and the output terminal 11b through a capacitance element 13.

Assuming that the impedance element U is substituted with a capacitance element (hereinafter referred to as the substitute capacitance element), the band-rejection filter described above has the function of an all-pass network of known bridge T type two-terminal pair circuit construction. Namely, in FIG. 8, where the impedance element U is substituted with the substitute capacitance element, if a wide-band signal is supplied between the input terminals 10a and 10b, its high-frequency component passes mainly through the substitute capacitance element but the low-frequency component mainly passes through the T type circuit formed with the inductance elements 12a and 12b and the capacitance element 13, with the result that the entire frequency component of the wide-band signal supplied between the input terminals 10a and 10b can be obtained between the output terminals 11a and 11b.

The impedance element U employed in the band-rejection filter according to this invention has the function of the capacitance element having the capacitance $C_T$, as described above. Accordingly, in the case where the impedance element U is constructed such that the value of the capacitance $C_T$ of the impedance element may be substantially equal to the capacitance value of the aforesaid substitute capacitance element in the aforesaid all-pass network and that the aforementioned predetermined frequency $f_2$ may be in the high frequency band of the high frequency component mentioned above, if a signal which is outside of the band centering about the aforesaid predetermined frequency $f_2$ is supplied between the input terminals 10a and 10b, this signal is derived between the output terminals 11a and 11b in exactly the same manner as described above in connection with the all-pass network, since the impedance element U serves as the substitute capacitance element in the abovesaid all-pass network. However, where a signal having the aforesaid predetermined frequency $f_2$ is supplied between the input terminals 10a and 10b, since the impedance element U exhibits a maximum impedance between the terminals 4a and 4b at that frequency, the signal hardly passes through the impedance element U. On the other hand, the above construction of the impedance element U employed in this invention can be obtained by suitably selecting the distance between adjacent fingers of the electrodes E1 and E2 of the transducer 3 of the electro-elastic surface wave transducing device TD, the width of each finger, etc. Consequently, the band-rejection filter F shown in FIG. 8 has the band-rejection filter characteristic depicted in FIG. 6.

Figure 9:
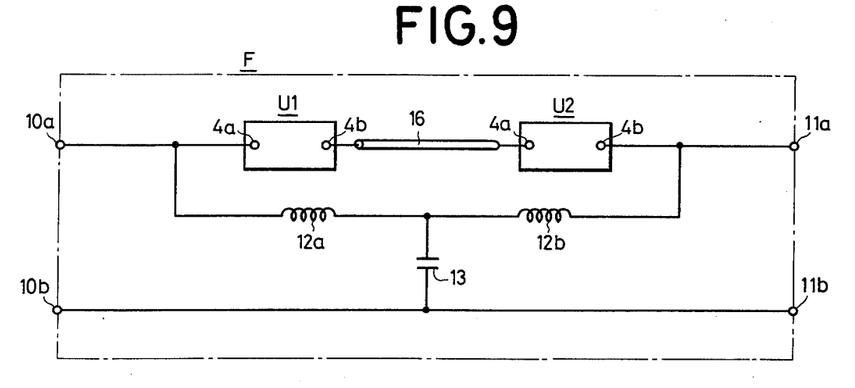

FIG. 9 shows a fourth embodiment of the band-rejection filter according to this invention. The present example is identical in construction with the FIG. 8 example except that two impedance elements (hereinafter identified by U1 and U2) similar to that used in the FIG. 8 example are employed and connected to each other through a transmission line 16 similar to those 14a and 14b referred to previously in connection with FIG. 7. Therefore, in FIG. 9, parts corresponding to those in FIG. 8 are identified by the same reference numerals and characters and no detailed description will be repeated. Since the two impedance elements U1 and U2 are connected in series between the input and output terminals 10a and 11a, it is possible to obtain a band-rejection filter characteristic that attenuation in the rejection band is twice that obtainable with the FIG. 8 embodiment.

Figure 10:
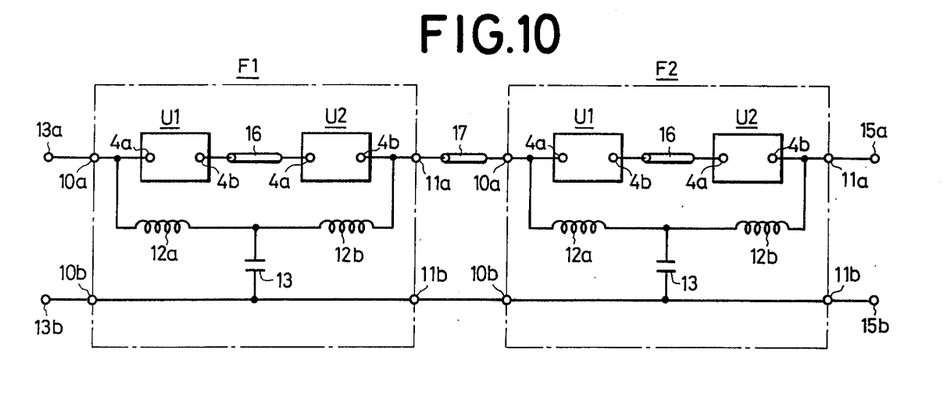

FIG. 10 illustrates a tenth embodiment of the band-rejection filter according to this invention. The present embodiment has such a construction that two band-rejection filters, (hereinafter identified by F1 and F2) each of which is identical with the filter F mentioned above with regard to FIG. 9, are connected to each other in cascade manner. The input terminals 10a and 10b of the filter F1 are connected to input terminals 13a and 13b of the filter of this example, respectively. The output terminals 11a and 11b of the filter F2 are connected to output terminals 15a and 15b, respectively. The output terminal 11a of the filter F1 and the input terminal 10a of the filter F2 are connected to each other through a line 17 similar to the transmission line 16 described above in connection with FIG. 9. The output terminal 11b of the filter F1 and the input terminal 10b of the filter F2 are directly connected to each other.

Since the FIG. 10 embodiment has the construction that two band-rejection filters, each identical with that employed in the FIG. 9 embodiment, are interconnected in cascade manner, it is possible to obtain a band-rejection filter characteristic which is more excellent than that obtainable with the band-rejection filter of FIG. 9.

Figure 11A:
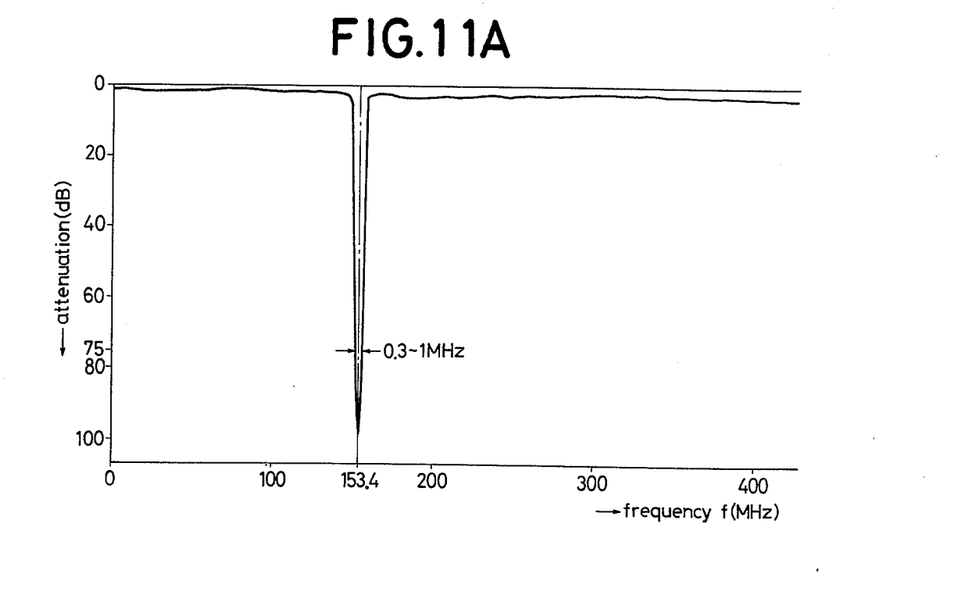
FIG. 11A is a graph showing the characteristic of the band-rejection filter of FIG. 10.
Figure 11B:
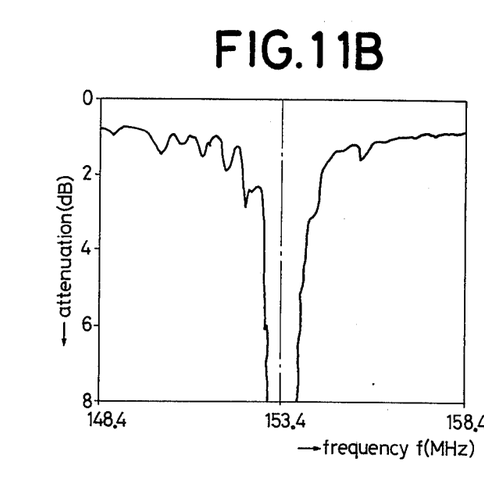
FIG. 11B shows, on an enlarged scale, one part of the curve depicted in FIG. 11A.

FIGS. 11A and 11B show measured results of the band-rejection filter characteristic of the band-rejection filter of FIG. 10 in which the impedance elements U1 and U2 were adapted so that the aforesaid predetermined frequency $f_2$ might be 154.3MHz. The measured results indicate that attenuation in the rejection band is far larger than that in the other frequency bands, that the rejection band-width $\Delta f$ at an attenuation of 75dB is in the range of 60KHz and that the band-rejection filter characteristic is sharp.

The FIGS. 8 to 10 embodiments have been described in connection with the case where the capacitance element of the all-pass network of the bridge T type two-terminal pair circuit construction in which the capacitance elements are connected between one of the pair of input terminals and one of the pair of output terminals is replaced with the impedance element U (or elements U1 and U2) of this invention. However, it is also possible to employ such a construction that at least one of capacitance elements of an all-pass network including other inductance elements or devices and the capacitance elements is replaced with the impedance element U (or elements U1 and U2).

FIGS. 12, 13, 14 and 15 illustrate sixth, seventh, eighth and ninth embodiments of this invention in which at least one of the capacitance elements of the abovesaid all-pass network is replaced with the impedance element of this invention.

Figure 12:
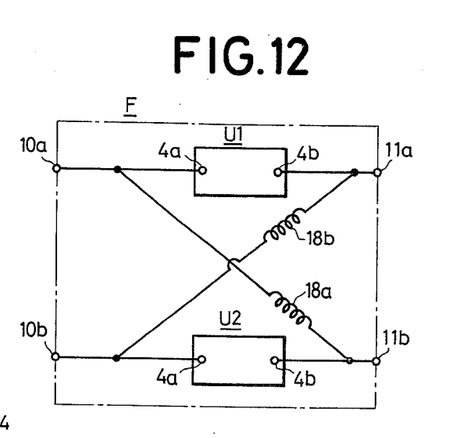
FIGS. 12, 13, 14 and 15 are connection diagrams illustrating sixth, seventh, eighth and ninth embodiments of the band-rejection filter according to this invention, respectively.

The FIG. 12 embodiment has a construction that a capacitance element of the all-pass network of the so-called primary lattice type two-terminal pair circuit construction. In FIG. 12, parts corresponding to those in FIG. 8 are indicated by the same reference numerals and characters and no detailed description will be repeated. The input terminals 10a and 10b and the output terminals 11a and 11b are connected to each other through elements U1 and U2, each formed with the aforesaid impedance element U. Further, the input terminals 10a and 10b and the output terminals 11a and 11b are connected to each other through inductance elements 18a and 18b, respectively.

Figure 13:
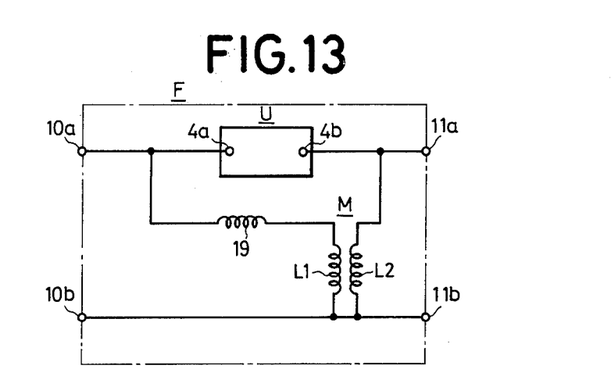

In FIG. 13, a capacitance element of an all-pass network of the so-called Jaumann type construction is substituted with the impedance element U of this invention. The input terminal 10a is connected to the output impedance 11a through the impedance element U. The input terminals 10a and 10b are interconnected through an inductance element 19 and a primary winding L1 of a transformer M serving as an inductance element. Further, the output terminals 11a and 11b are connected to each other through a secondary winding L2 of the transformer M and the input terminals 10b and the output terminal 11b are connected directly to each other.

Figure 14:
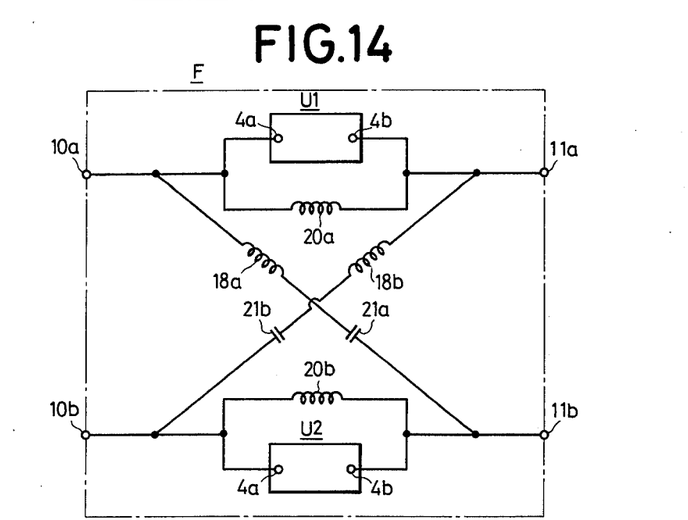

The FIG. 14 embodiment has a construction, similar to that of FIG. 12, in which capacitance elements of an allpass network of the so-called secondary lattice type two-terminal pair circuit construction are substituted with the impedance elements U. The illustrated example is identical in construction with the example of FIG. 12 except that inductance elements 20a and 20b are connected in parallel with the elements U1 and U2, respectively, and that capacitance elements 21a and 21b are connected in series with the inductance elements 18a and 18b, respectively.

Figure 15:
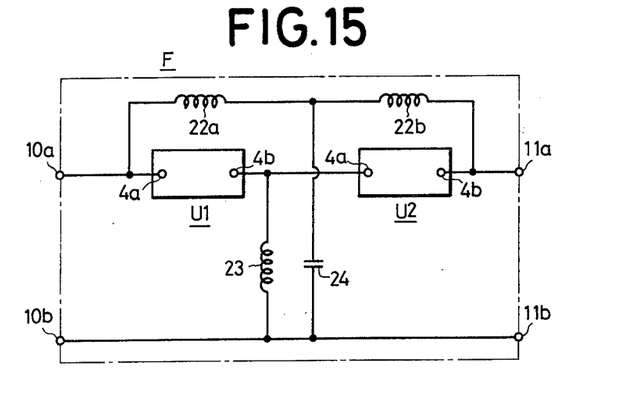

In FIG. 15, capacitance elements of an all-pass network of the so-called twin T type circuit construction are replaced with impedance elements. The input and output terminals 10a and 11a are interconnected through a parallel connection of a series circuit of the impedance elements U1 and U2 and a series circuit of inductance elements 22a and 22b. The connection point of the impedance elements U1 and U2, the input terminal 10b and the output terminal 11b are interconnected through an inductance element 23. Further, the connection point of the inductance elements 22a and 22b and the terminals 10b and 11b are interconnected through a capacitance element 24.

The band-rejection filters of this invention, shown in FIGS. 12 to 15, provide the same band-rejection filter characteristic as the obtainable with the band-rejection filters illustrated in FIGS. 8, 9 and 10, though not described in detail.

Figure 16:
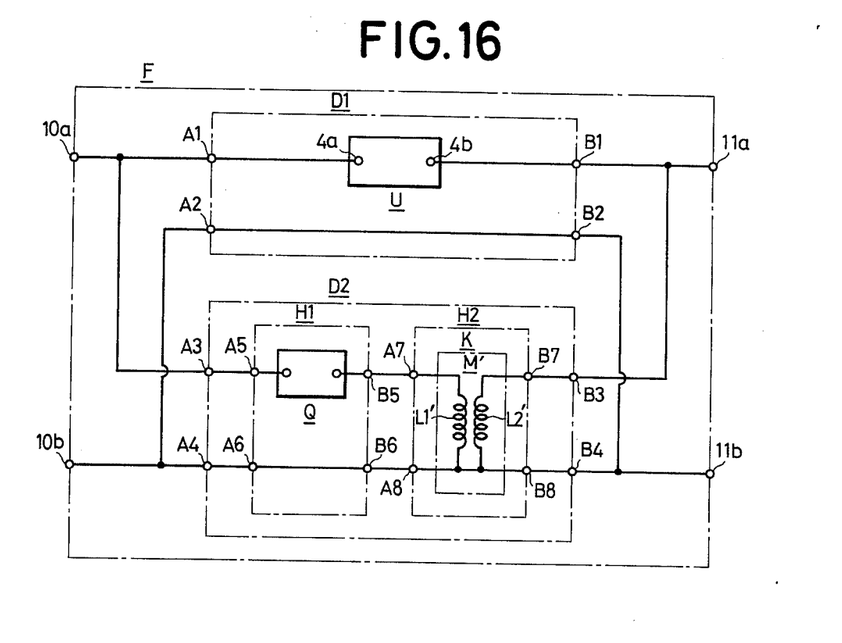
FIG. 16 is a connection diagram showing of a tenth embodiment of the band-rejection filter according to this invention.

FIG. 16 illustrates a tenth embodiment of the present invention. In FIG. 16, parts corresponding to those in FIG. 3 are identified by the same reference numerals and characters and no detailed description will be repeated. A two-terminal pair circuit D1 having a pair of input terminals A1 and A2 and a pair of output terminals B1 and B2 is connected in parallel with a two-terminal pair circuit D2 having a pair of input terminals A3 and A4 and a pair of output terminals B3 and B4. The input and output sides of the above parallel circuit are connected to the input terminals 10a and 10B and the output terminals 11a and 11b, respectively.

The two-terminal pair circuit D1 has a construction that the input terminal A1 and the output terminal B1 are interconnected through the impedance element U and that the input terminal A2 and the output terminal B2 are directly connected to each other.

In the two-terminal pair circuit D2, a two-terminal pair circuit H1, which has a pair of input terminals A5 and A6 and a pair of output terminals B5 and B6, and a two-terminal pair circuit H2, which similarly has a pair of input terminals A7 and A8 and a pair of output terminals B7 and B8, are connected to each other in cascade. For example, the two-terminal pair circuit H2 is disposed at the stage following the circuit H1. The two-terminal pair circuit H1 has such a construction that the input terminal A5 is connected to the output terminal B5 through a one-terminal pair impedance element Q formed with, for example, a resistance element which exhibits an impedance substantially equal to a maximum impedance of the impedance element U at the predetermined frequency $f_2$, and that the input terminal A6 is directly connected to the output terminal B6. On the other hand, the two-terminal pair circuit H2 is formed with a phase inverter circuit K which comprises a transformer M' having a winding ratio of 1:1 and in which primary and secondary windings L1' and L2' are connected at one end to the input and output terminals A7 and B7, respectively, and at the other end to the input and output terminals A8 and B8, respectively.

With the above band-rejection filter of this invention, since the circuit D1 includes the impedance element U as described above, a signal, which is to be obtained between the output terminals 11a and 11b through the two-terminal pair circuit D1 based on a wide-band signal supplied between the input terminals 10a and 10b, is subjected to sufficiently small attenuation in the frequency components outside of the predetermined rejection band centering about the aforesaid center frequency $f_2$ but is subjected to sufficiently large attenuation in the frequency component having the predetermined frequency $f_2$. Thus, the sharp band-rejection filter characteristic described previously with regard to FIG. 6 is obtained in the system of the input terminals 10a and 10b, the two-terminal pair circuit D1 and the output terminals 11a and 11b. On the other hand, in the case of a signal derived between the output terminals 11a and 11b through the two-terminal pair circuit D2 based on the wide-band signal supplied between the input terminals 10a and 10b, since the circuit D2 is a cascade connection circuit of the two-terminal pair circuits H1 and H2, since the circuit H1 includes the impedance element Q exhibiting an impedance substantially equal to the maximum impedance of the impedance element U at the predetermined frequency $f_2$ and since the circuit H2 is formed with the phase inverter circuit K, this signal is opposite in phase to the component of the frequency $f_2$ contained in the signal which is obtained in the system of the input terminals 10a and 10b, the two-terminal pair circuit D1 and the output terminals 11a and 11b. And the amount of attenuation of the signal obtained through the circuit D2 is substantially equal to that of the above signal obtained through the circuit D1.

Accordingly, with the FIG. 16 embodiment, it is possible to obtain an extremely sharp band-rejection filter characteristic that attenuation outside of the predetermined rejection band centering about the frequency $f_2$ is dependent upon attenuation in the two-terminal pair circuit D1 and that attenuation in the rejection band is far larger than that outside thereof.

FIGS. 17, 18, 19 and 20 illustrate eleventh, twelfth, thirteenth and fourteenth embodiment equivalently converted from the tenth embodiment of the band-rejection filter of this invention shown in FIG. 6.

Figure 17:
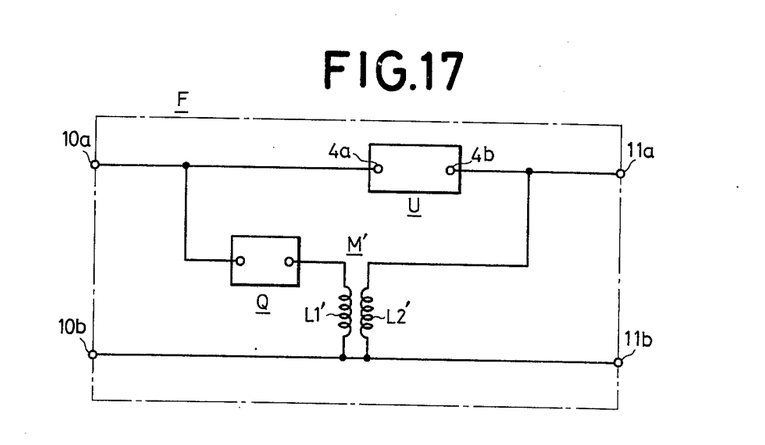
FIGS. 17, 18, 19 and 20 are connection diagrams illustrating eleventh, twelfth, thirteenth and fourteenth embodiments equivalently converted from the tenth embodiment of FIG. 16.

The FIG. 17 embodiment is identical in construction with the FIG. 16 embodiment except in the following points. Namely, in the construction shown in FIG. 16, the line, through which are connected the input terminal 10b, the input terminal A2 of the two-terminal pair circuit D1, its output terminal B2 and the output terminal 11b, and the line, through which are connected the input terminal 10b, the input terminal A4 of the two-terminal pair circuit D2, the input terminal A6 and the output terminal B6 of the two-terminal pair circuit H1, the input terminal A8 and the output terminal B8 of the two-terminal pair circuit H2, the output terminal B4 of the two-terminal pair circuit D2 and the output terminal 11b, are common to them.

Figure 18:
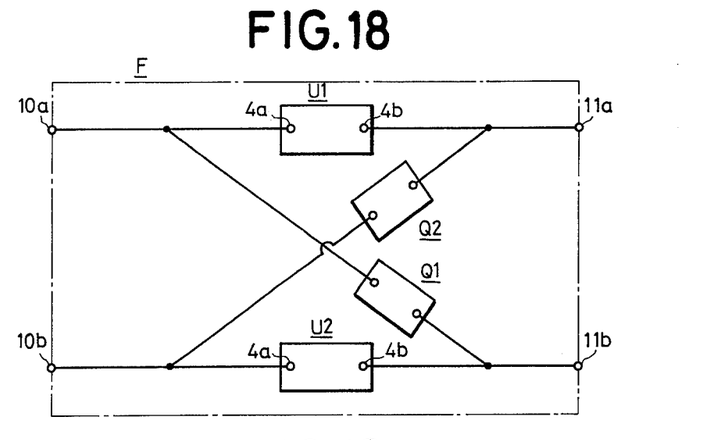

In the embodiment illustrated in FIG. 18, one input terminal 10a and one output terminal 11a are connected to each other through an element U1 formed with the impedance element U and the other input and output terminals 10b and 11b are connected to each other through an element U2 similarly formed with the impedance element U. Further, the input terminals 10a and 10b are connected to the output terminals 11b and 11a respectively through elements Q1 and Q2, each formed with the impedance element Q described previously in connection with FIG. 16.

Figure 19:
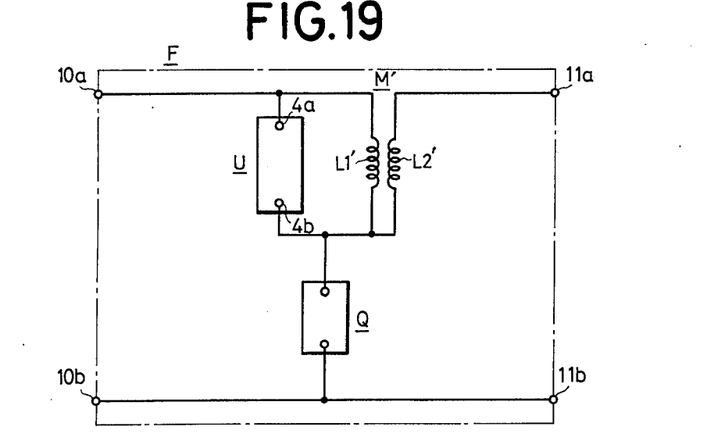

In the embodiment of FIG. 19, a series circuit of the impedance element U and the aforesaid impedance element Q is connected in series between the input terminals 10a and 10b; the primary winding L1' of the transformer M' forming the two-terminal pair circuit H2 described above with regard to FIG. 16 is connected in parallel with the impedance element U; and the secondary winding L2' of the transformer M' is connected at one end to the output terminal 11a and at the other end to the connection point of the impedance elements U and Q.

Figure 20:
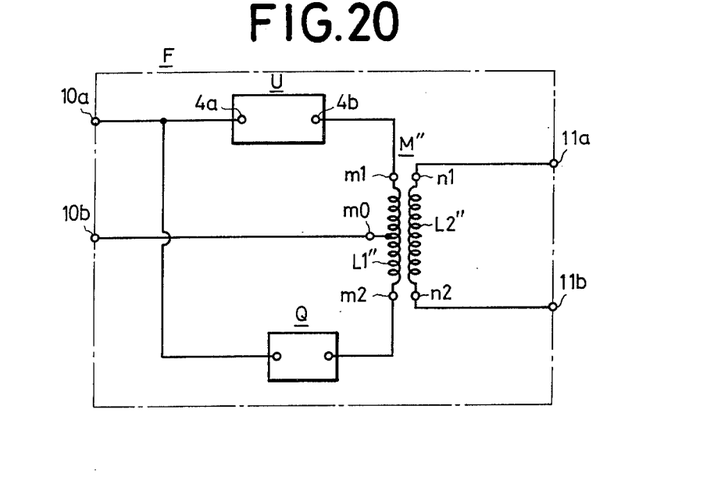

In the embodiment of FIG. 20, one input terminal 10a is connected to one end m1 of a primary winding L1" of a transformer M" through the impedance element U and to the other end m2 of primary winding L1" through the one-terminal pair impedance element Q described above with regard to FIG. 16. The other input terminal 10b is connected to mid point m0 of the primary winding L1" of the transformer M" and both ends n1 and n2 of a secondary winding L2" of the transformer M" are connected to the output terminals 11a and 11b, respectively.

With the embodiments of the band-rejection filter of this invention shown in FIGS. 17, 18, 19 and 20, it is possible to obtain the same excellent band-rejection filter characteristic as that obtainable with the FIG. 16 embodiment, though no detailed description is given.

It will be apparent that the foregoing examples should be construed as merely illustrative of this invention and should not be construed as limiting this invention specifically thereto and that many modifications and variations may be effected without departing from the scope of the novel concept of this invention.

We claim as our invention

1. An impedance element which is formed with an electro-elastic surface wave transducing device composed of a substrate for the propagation of an elastic surface wave and an electro-elastic surface wave transducer disposed on said substrate for converting an electrical signal into an elastic surface wave or vice versa and in which said electro-elastic surface wave transducer has electrodes of interdigital conductor structure, and terminals connected to said electrodes characterized in that the number of fingers of the interdigital conductors of said electrodes is large enough and their spacing small enough that the direct capacitive impedance there between is less than the inductive impedance coupled to said capacitive impedance by the resonant mechanical motion of said elastic surface whereby the device exhibits an impedance that is inductive only in a first frequency band between a first and a second frequency and that is capacitive in all other frequency bands and that said impedance is higher in a second frequency band centered on said second frequency than in the other frequency bands, and said first frequency is a little higher than the resonant frequency of electro-elastic surface wave transducer.

2. An impedance element according to claim 1 in which said substrate is formed of lithium niobate and the number of the fingers of the interdigital conductors of the electrodes of the electro-elastic surface wave transducer of said electro-elastic surface transducing device is selected in the range of 200 to 300.

3. A band-rejection filter which has a pair of input terminals and a pair of output terminals, one of said pair of input terminals and one of said pair of output terminals being connected to each other through a parallel circuit of an impedance element comprising a plurality of interdigitating electrodes on an electro-elastic substrate that exhibits an inductive impedance in a band of frequencies and a series circuit of inductors and the other input terminal and the other output terminal being directly connected to each other, and a capacitor connected between the connecting point of the inductors and the other input and output terminals.

4. A band-rejection filter which has a pair of input terminals and a pair of output terminals, one of said pair of input terminals and one of said pair of output terminals being connected to each other through a parallel circuit of a series circuit of impedance elements each comprising a plurality of inter-digitating electrodes on an electro-elastic substrate that exhibits an inductive impedance in a band of frequencies and a series circuit of inductors and the other input terminal and the other output terminal being directly connected to each other, and a capacitor connected between the connecting point of the inductors and the other input and output terminals.

5. A band-rejection filter comprising a plurality of band-rejection filters connected to each other in cascade through a transmission line wherein each band-rejection filter comprises a pair of input terminals and a pair of output terminals, one of said pair of input terminals and one of said pair of output terminals being connected to each other through a parallel circuit of a series circuit of impedance elements each comprising a plurality of interdigitating electrodes on an electro-elastic substrate that exhibits an inductive impedance in a band of frequencies and a series circuit of inductors and the other input terminal and the other output terminal being directly connected to each other, and a capacitor connected between the connecting point of the inductors and the other input and output terminals.

6. A band-rejection filter which has a pair of input terminals and a pair of output terminals, one of said pair of input terminals being connected to one of said pair of output terminals and the other input terminal through a first impedance element comprising a plurality of inter-digitating electrodes on an electro-elastic substrate that exhibits an inductive impedance in a band of frequencies and a series circuit of a second impedance element and a primary winding of a transformer respectively and one of said pair of output terminals and the other output terminal being connected to each other through a secondary winding of the transformer.

7. A band-rejection filter according to claim 6, wherein the second impedance element is an inductor.

8. A band-rejection filter which has a pair of input terminals and a pair of output terminals, one of said input terminals and a pair of output terminals, one of said input terminals being connected to one of said pair of output terminals and the other output terminal through a first parallel circuit of the first impedance element comprising a plurality of interdigitating electrodes on an electro-elastic substrate that exhibits an inductive impedance in a band of frequencies and a first inductor and a series circuit of a second inductor and first capacitor respectively and the other input terminal being connected to one of said pair of output terminals and the other terminal through a second series circuit of a second capacitor and a third inductor and a parallel circuit of the second impedance element comprising a plurality of interdigitating electrodes on a electro-elastic substrate that exhibits an inductive impedance in a band of frequencies and a fourth inductor.

9. A band-rejection filter which has a pair of input terminals and a pair of output terminals, one of said pair of input terminals being connected to one of said pair of output terminals through a parallel circuit of a first series circuit of impedance elements each comprising a plurality of interdigitating electrodes on an electro-elastic substrate that exhibits an inductive impedance in a band of frequencies and a second series circuit of first and second inductors and a first connection point of the impedance elements and a second connection point of the first and second inductors being connected to the other input and output terminals through a third inductor and a capacitor respectively.

10. A band-rejection filter which has a pair of input terminals and a pair of output terminals, one of said pair of input terminals being connected to one of said pair of output terminals and the other input terminal through a first impedance element comprising a plurality of interdigitating electrodes on an electro-elastic substrate that exhibits an inductive impedance in a band of frequencies and a series circuit of a second impedance element and a primary winding of a transformer respectively, one of said pair of output terminals being connected to the other output terminal through a secondary winding of the transformer and the other input and output terminals being directly connected to each other.

11. A band-rejection filter which has a pair of input terminals and a pair of output terminals, one of said pair of input terminals being connected to the other input terminal and one of said pair of output terminals through a series circuit of a parallel circuit of a first impedance element comprising a plurality of interdigitating electrodes on an electro-elastic substrate that exhibits an inductive impedance in a band of frequencies and a primary winding of a transformer and a second impedance element and one of said pair of terminals being connected to the other input and output terminals through a series circuit of a secondary winding of the transformers and the second impedance element.

12. A band-rejection filter which has a pair of input terminals and a pair of output terminals, one of said pair of input terminals being connected to first and second ends of a primary winding of a transformer through an impedance element comprising a plurality of interdigitating electrodes on an electro-elastic substrate that exhibits an inductive impedance in a band of frequencies and a second impedance element respectively, the other input terminal being connected to a mid point of the primary winding of the transformer and the pair of output terminals being connected to each other through a secondary winding of the transformer.

* * * * *